United States Patent
Lim

(10) Patent No.: US 7,737,516 B2
(45) Date of Patent: Jun. 15, 2010

(54) IMAGE SENSOR

(75) Inventor: Hyun-Ju Lim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 174 days.

(21) Appl. No.: 11/844,609

(22) Filed: Aug. 24, 2007

(65) Prior Publication Data

US 2008/0099865 A1 May 1, 2008

(30) Foreign Application Priority Data

Oct. 30, 2006 (KR) ............ 10-2006-0105472

(51) Int. Cl.
*H01L 31/0232* (2006.01)
(52) U.S. Cl. .............. 257/432; 257/444; 257/443; 257/E27.111
(58) Field of Classification Search ......... 257/184, 257/187, 257, 291, 432, 498–512, E27.111; 438/48–65; 349/33–54, 139–152
See application file for complete search history.

(56) References Cited

U.S. PATENT DOCUMENTS

| | | | |
|---|---|---|---|
| 6,373,117 B1 * | 4/2002 | Theil ............ | 257/444 |
| 6,501,065 B1 * | 12/2002 | Uppal et al. ...... | 250/214.1 |
| 2004/0238911 A1 | 12/2004 | Roy | |
| 2005/0067639 A1 * | 3/2005 | Jeon et al. ....... | 257/291 |
| 2006/0113622 A1 * | 6/2006 | Adkisson et al. ..... | 257/443 |
| 2006/0145217 A1 * | 7/2006 | Sohn ............ | 257/294 |

FOREIGN PATENT DOCUMENTS

KR   1020060108378 A   10/2006

OTHER PUBLICATIONS

"The PN Junction Diode" vol. II second edition "Modular Seried on Solid State Devices" by Gerold W. Neudeck 1983 Addison-Wesley.*
"Microchip Fabrication"—A Practical Guide to semiconductor processing, fourth edition. by Peter Van Zant year 2000 McGraw-Hill Professional Publishing.*
Gerold W. Neudeck ("The PN Junction Diode" vol. II second edition "Modular Series on Solid State Devices") 1989.*

* cited by examiner

*Primary Examiner*—Wai-Sing Louie
*Assistant Examiner*—Sue Tang
(74) *Attorney, Agent, or Firm*—Sherr & Vaughn, PLLC

(57) ABSTRACT

Embodiments relate to an image sensor and a method for manufacturing an image sensor. According to embodiments, a transistor structure may be manufactured on a semiconductor substrate, and an insulating layer covering the transistor structure may be formed. The insulating layer may be patterned to form a first via that may expose the semiconductor substrate, and a silicon layer may be formed on the first via and the insulating layer. The silicon layer and the insulating layer may be patterned to form a second via exposing the transistor structure, and the second via may be filled with metal to form a connecting line electrically connected with the transistor structure. Conductive impurities may be implanted into the silicon layer and may form a light receiving portion connected with the connecting line.

9 Claims, 3 Drawing Sheets

IMAGE SENSOR

The present application claims priority under 35 U.S.C. 119 and 35 U.S.C. 365 to Korean Patent Application No. 10-2006-0105472 (filed on Oct. 30, 2006), which is hereby incorporated by reference in its entirety.

BACKGROUND

An image sensor may be a semiconductor device that may convert optical images into electrical signals. Examples of an image sensor may include charged coupled devices (CCDs) and complementary metal oxide semiconductor (CMOS) image sensors.

In a method for manufacturing an image sensor, transistors and photodiodes, which may be electrically connected to the transistors, may be formed on a semiconductor substrate. An interlayer insulating layer and a line may be formed on the transistors and the photodiodes. Subsequently, microlenses, which may provide condensed light onto the photodiodes, may be formed on the interlayer insulating layer.

In an image device, incident light from an outside source may be condensed by the microlenses and may pass through the interlayer insulating layer and may be incident onto the photodiodes. A portion of light incident from the outside may be absorbed in the interlayer insulating layer. Hence, an amount of light that actually reaches the photodiodes may be different from an amount of light before the light passes through the interlayer insulating layer. This may reduce certain characteristics of the image device.

SUMMARY

Embodiments relate to an image device and a manufacturing method thereof, that may reduce or minimize a light loss.

In embodiments, an image device/sensor may include a transistor structure disposed on a silicon substrate, an insulating layer disposed on the silicon substrate to insulate the transistor structure, a silicon layer disposed on the insulating structure and connected with the silicon substrate through a first via, a light receiving portion formed in the silicon layer and doped with ions of low concentration, a connecting line formed in a second via to electrically connect the light receiving portion with the transistor structure, and color filters disposed on the light receiving portion.

In embodiments, a method for manufacturing an image device/sensor may include manufacturing a transistor structure on a semiconductor substrate, forming an insulating layer structure covering the transistor structure, patterning the insulating layer structure to form a first via exposing the semiconductor substrate, forming a silicon layer on the first via and the insulating layer structure, patterning the silicon layer and the insulating layer structure to form a second via exposing the transistor structure, filling the second via with metal to form a connecting line electrically connected with the transistor structure, implanting conductive impurities into the silicon layer to form a light receiving portion connected with the connecting line, and forming color filters on the light receiving portion.

DRAWINGS

DESCRIPTION

Figure 1:
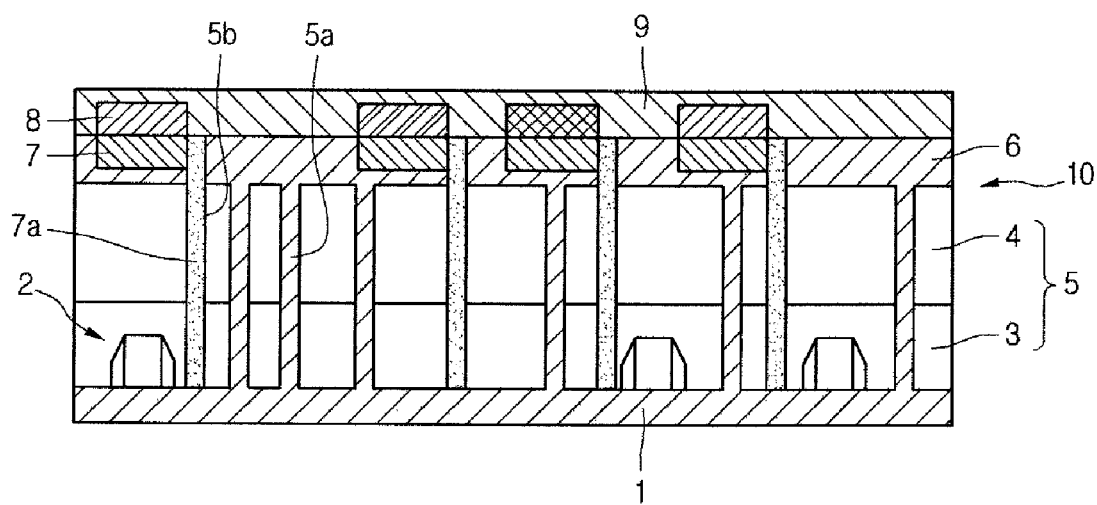
FIG. 1 is a cross-sectional drawing of an image device according to embodiments.

Referring to FIG. 1, image device 10 may include silicon substrate 1, transistor structure 2, insulating layer structure 5, silicon layer 6, light receiving portion 7, connecting line 7a, color filters 8, and planarization layer 9.

Silicon substrate 1 may be a wafer, which may be a single crystal silicon substrate, in embodiments.

Transistor structure 2 may be formed on silicon substrate 1, for example using a thin film manufacturing process. In embodiments, transistor structure 2 may include three thin film transistors, four thin film transistors, and/or five thin film transistors, which may output an electrical signal corresponding to an amount of light received in light receiving portion 7.

Insulating layer structure 5 may be disposed on silicon substrate 1 including transistor structure 2. Insulating layer structure 5 may include back end of line (BEOL) layer 3, which may contact silicon substrate 1, and front end of line (FEOL) layer 4, which may be disposed on BEOL layer 3.

Silicon layer 6 may be disposed on FEOL layer 4 of insulating layer structure 5. Silicon layer 6 may be connected with silicon substrate 1 through first via 5a passing through insulating layer structure 5.

Light receiving portion 7 may be disposed in silicon layer 6. Light receiving portion 7 may include conductive impurities implanted into a portion of silicon layer 6. Light receiving portion 7 may generate an electrical signal corresponding to an amount of light incident from an outside.

Connecting line 7a may provide an electrical signal generated by light receiving portion 7 to transistor structure 2. To provide the electrical signal generated by light receiving portion 7 to transistor structure 2, insulating layer structure 5 and silicon layer 6 may include second via 5b exposing an input terminal of transistor structure 2.

Connecting line 7a may be formed in second via 5b. In embodiments, connecting line 7a may include W, Ti, Al, an Al alloy, and Cu.

Color filter 8 may be formed at a position corresponding to light receiving portion 7 and may filter light incident to light receiving portion 7. Color filters 8 may include a red color filter, a green color filter, and a blue color filter.

Also, the red color filter, the green color filter, and the blue color filter forming color filters 8 can have different thicknesses, respectively.

Planarization layer 9 may be disposed on color filters 8. In embodiments, planarization layer 9 may be formed if the red color filter, the green color filter, and the blue color filter have different thicknesses, respectively.

Light that has passed through the color filter 8 may be incident to light receiving portion 7, which may generate a sensing signal corresponding to an amount of the incident light. A sensing signal corresponding to an amount of light incident to light receiving portion 7 may be provided to an input terminal of transistor structure 2 through connecting line 7a formed in second via 5b. The sensing signal input through connecting line 7a may be transmitted to a system according to a designated timing.

According to embodiments, an interval between the color filter 8 and light receiving portion 7 may be reduced, which may minimize a loss of light that has passed through the color filter 8. This may improve image quality.

Since a microlens structure may not need to be formed on color filters 8 in an image device according to embodiments, a manufacturing process may be shortened even more.

According to embodiments, since a limitation in the area and arrangement of light receiving portion 7 may be reduced by a metal line disposed between light receiving portion 7 and transistor structure 2, a degree of integration of an image device may be improved.

A method for manufacturing an image device according to embodiments will next be described.

Figure 2:
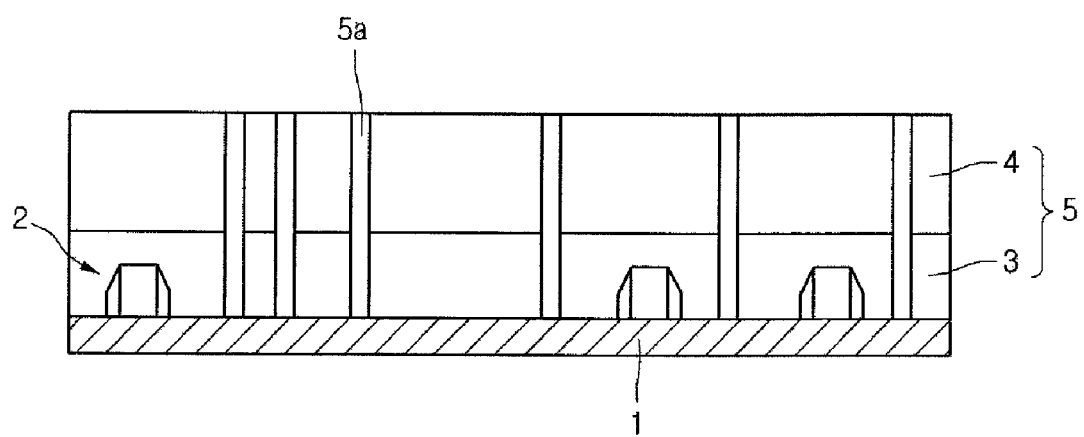
FIG. 2 is a cross-sectional drawing illustrating a transistor structure and an insulating layer structure of an image sensor according to embodiments.

Referring to FIG. 2, transistor structure 2 may be formed on semiconductor substrate 1, for example, a silicon substrate. In embodiments, transistor structure 2 may include three to five transistors that may be connected to one light receiving portion, which will be described later.

BEOL layer 3, which may cover transistor structure 2, and FEOL layer 4, which may be on the BEOF layer 3, may be sequentially formed over semiconductor substrate 1. Hereinafter, BEOL layer 3 and FEOL layer 4 may be referred to as insulating layer structure 5.

Insulating layer structure 5 may then be patterned to form a first via 5a, which may expose a portion of semiconductor substrate 1.

In embodiments, first via 5a may be formed by patterning insulating layer structure 5 through a reactive ion etching (RIE) process. The RIE process may use a photoresist pattern (not shown) in which an opening may be formed at a portion corresponding to first via 5a as an etch mask. In embodiments, an ion implantation process may be blocked and a single crystal silicon may remain at a portion of semiconductor substrate 1 where first via 5a has been formed so that an active layer may not be formed during an FEOL process.

Figure 3:
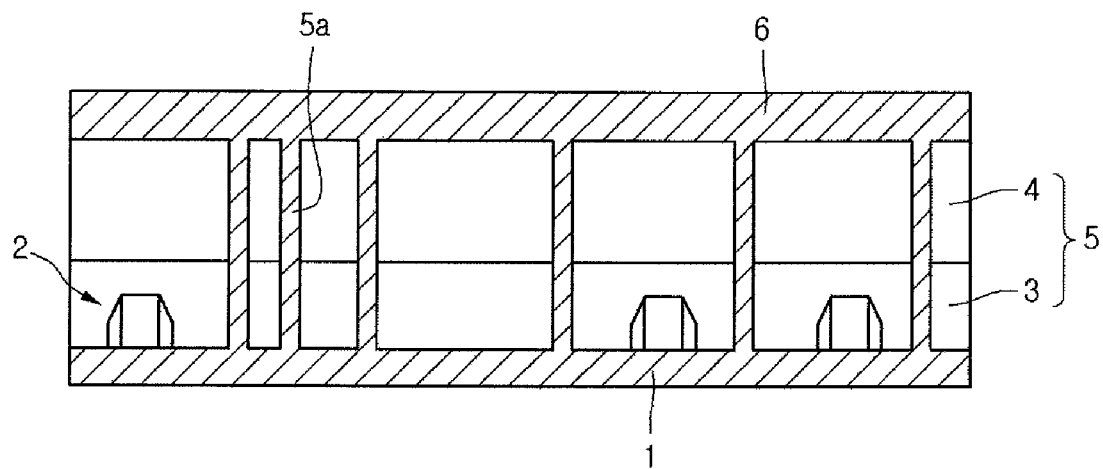
FIG. 3 is a cross-sectional drawing of a silicon layer formed on the insulating layer structure shown in FIG. 2, according to embodiments.

Referring to FIG. 3, an epitaxial process using semiconductor substrate 1 exposed through first via 5a as a seed may be performed. The single crystal silicon of semiconductor substrate 1 may thus be grown to the upper surface of FEOL layer 4 of insulating layer structure 5 through first via 5a, and may form silicon layer 6 on insulating layer structure 5. If the step coverage of silicon layer 6 is poor, silicon layer 6 may be planarized, for example using a chemical mechanical polishing (CMP) process.

Figure 4:
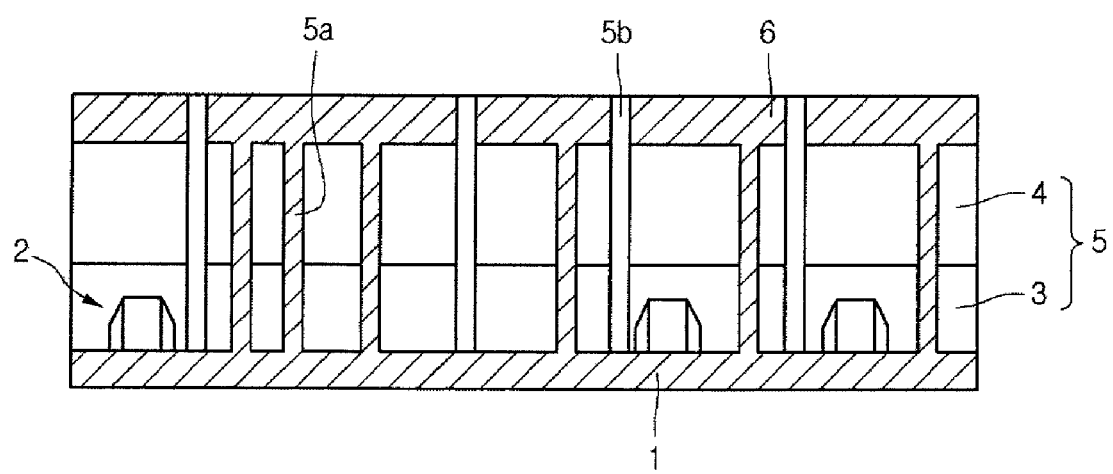
FIG. 4 is a cross-sectional drawing illustrating a second via formed on the silicon layer and the insulating layer structure shown in FIG. 3, according to embodiments.

Referring to FIG. 4, after silicon layer 6 is formed, silicon layer 6 and insulating layer structure 5 may be patterned to form second via 5b. Second via 5b may be formed at a position corresponding to an input terminal of transistor structure 2.

According to embodiments, second via 5b may be formed using an RIE process that may use a photoresist pattern as an etch mask. Since etching through the RIE process may increase etching selectivity associated with an oxide layer ($SiO_2$) and a single crystal silicon forming insulating layer structure 5, a separate etch stopper layer or etch stopper structure may not need to be formed.

Figure 5:
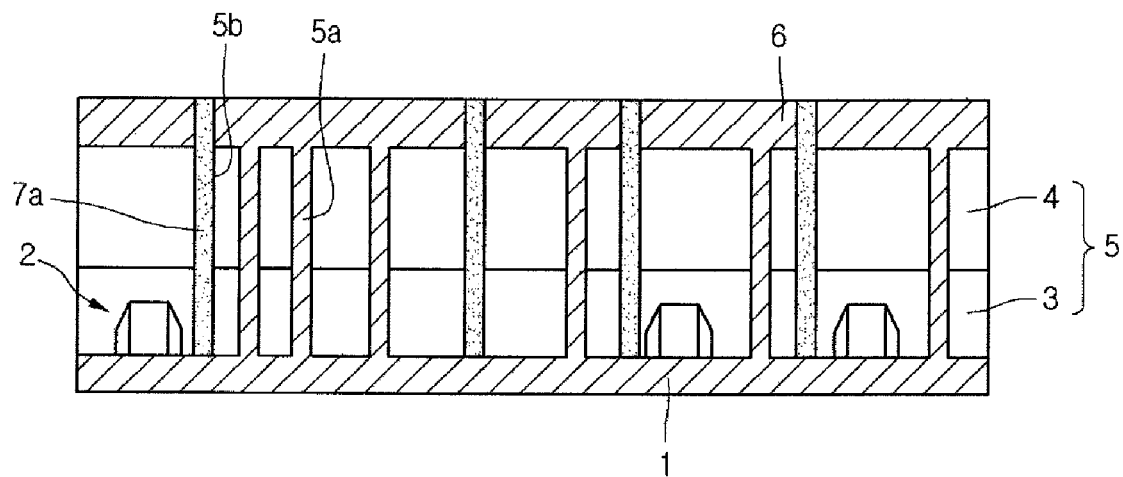
FIG. 5 is a cross-sectional drawing illustrating a connecting line formed in the second via shown in FIG. 4, according to embodiments.

Referring to FIG. 5, after forming second via 5b, second via 5b may be filled with metal to form a connecting line electrically connected with the transistor structure. This may be referred to as metal gap-fills. In embodiments, the metal may be deposited on upper surfaces of second via 5b and silicon layer 6. In embodiments, the metal may include W, Ti, Al, an Al alloy, and Cu. If Cu is used as metal, second via 5b may be formed using a damascene process and a dual damascene process.

After second via 5b is filled with metal and the metal is deposited on an upper surface of silicon layer 6 to form a metal layer, the metal layer disposed on the upper surface of silicon layer 6 may be removed, for example by a CMP process, detecting silicon layer 6 as an end point. Connecting line 7a may thus be formed in second via 5b.

Figure 6:
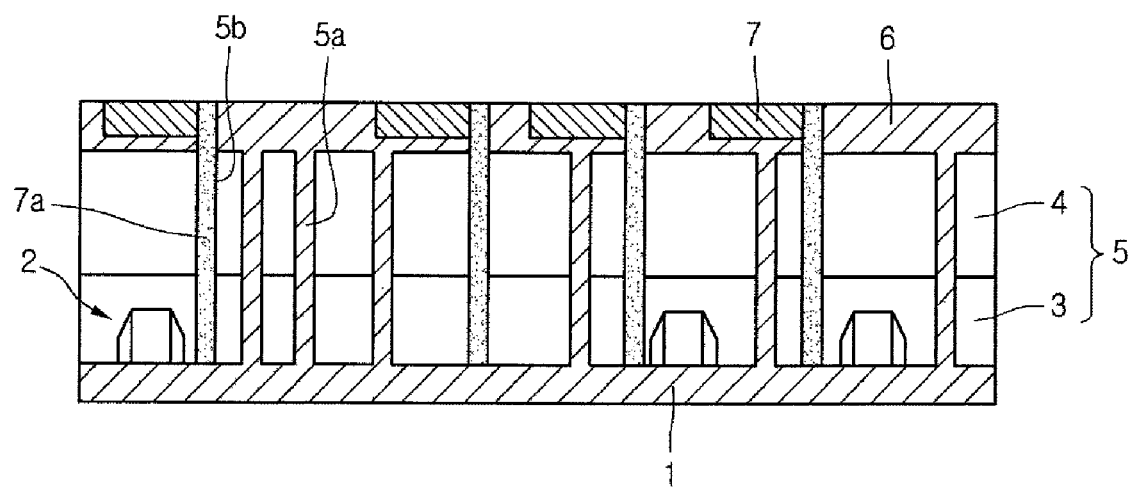
FIG. 6 is a cross-sectional drawing illustrating a light receiving portion formed on the silicon layer shown in FIG. 5, according to embodiments.

Referring to FIG. 6, conductive impurities may be implanted at low concentration into silicon layer 6 and may form light receiving portion 7. Light receiving portion 7 may be formed at a position corresponding to each transistor structure 2.

Referring again to FIG. 1, after forming light receiving portion 7, the red, green, and blue color filters may be formed on light receiving portion 7 to form color filters 8. Planarization layer 9, which may cover color filters 8, may be formed.

According to embodiments, since an amount of light incident to the light receiving portion of the image device sensing an amount of light may be increased, a quality of the image device may be enhanced.

According to embodiments, since an interval between the color filter and the light receiving portion may be minimized, separate microlenses may not need to be formed, and a manufacturing process of the image device may be shortened.

According to embodiments, since the light receiving portion may be disposed on an upper portion of the image device, there may be fewer limitations in the position and area of the light receiving portion caused by the metal line arranged between the light receiving portion and the transistor structure. Moreover, a degree of integration of the image device may be improved.

It will be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A method, comprising:

providing a transistor structure over a semiconductor substrate;

forming an insulating layer over the transistor structure;

patterning the insulating layer structure to form a first via exposing the semiconductor substrate;

forming a silicon layer over the first via and the insulating layer;

patterning the silicon layer and the insulating layer to form a second via exposing the transistor structure;

filling the second via with metal to form a connecting line electrically connected to the transistor structure;

implanting conductive impurities into the silicon layer to form a light receiving portion connected to the connecting line; and forming a color filter over the light receiving portion.

2. The method of claim 1, further comprising forming a planarization layer over the color filter.

3. The method of claim 1, wherein forming the insulating layer comprises:
   forming a front end of line layer over the semiconductor substrate; and
   forming a back end of line layer over the front end of the line layer.

4. The method of claim 1, wherein forming the first via comprises performing a reactive ion etching process.

5. The method of claim 1, wherein forming the second via comprises performing a reactive ion etching process.

6. The method of claim 1, wherein forming the connecting line comprises:
   forming a metal layer in the second via and over the insulating layer; and
   removing the metal layer from an upper surface of the insulating layer using a chemical mechanical polishing process.

7. The method of claim 6, wherein the metal layer comprises one of W, Ti, Al, and Al alloy, and Cu.

8. The method of claim 1, wherein forming the light receiving portion comprises implanting ions of a low concentration into a portion of the silicon layer.

9. A method, comprising:
   providing a transistor structure over a semiconductor substrate;
   forming an insulating layer over the transistor structure;
   patterning the insulating layer structure to form a first via exposing the semiconductor substrate;
   forming a silicon layer over the first via and the insulating layer;
   patterning the silicon layer and the insulating layer to form a second via exposing the transistor structure;
   filling the second via with metal to form a connecting line electrically connected to the transistor structure; and
   implanting conductive impurities into the silicon layer to form a light receiving portion connected to the connecting line,
   wherein the forming the silicon layer comprises performing an epitaxial growing process using the semiconductor substrate as a seed.

* * * * *